(12) United States Patent
Ota et al.

(10) Patent No.: US 8,835,333 B2
(45) Date of Patent: Sep. 16, 2014

(54) HEAT TREATMENT METHOD OF SEMICONDUCTOR WAFERS, MANUFACTURING METHOD OF SOLAR BATTERY, AND HEAT TREATMENT DEVICE

(71) Applicants: Narihito Ota, Tokyo (JP); Kunihiko Nishimura, Tokyo (JP)

(72) Inventors: Narihito Ota, Tokyo (JP); Kunihiko Nishimura, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 10 days.

(21) Appl. No.: 13/686,153

(22) Filed: Nov. 27, 2012

(65) Prior Publication Data

US 2013/0143348 A1    Jun. 6, 2013

(30) Foreign Application Priority Data

Dec. 1, 2011  (JP) ................................ 2011-263807
Oct. 30, 2012  (JP) ................................ 2012-239363

(51) Int. Cl.
| H01L 21/00 | (2006.01) |
| H01L 21/673 | (2006.01) |
| H01L 21/223 | (2006.01) |
| H01L 21/67 | (2006.01) |
| H01L 31/18 | (2006.01) |

(52) U.S. Cl.
CPC .............. *H01L 31/1876* (2013.01); *Y02E 10/50* (2013.01); *H01L 21/67303* (2013.01); *H01L 21/223* (2013.01); *H01L 21/67109* (2013.01)
USPC ..................... 438/795; 438/57; 257/E21.497

(58) Field of Classification Search
USPC ........... 438/502, 550; 257/E21.077, E21.084, 257/E21.333, E21.482, E21.497
See application file for complete search history.

(56) References Cited

U.S. PATENT DOCUMENTS 6,863,732 B2 *  3/2005  Asano et al. .................. 118/715

FOREIGN PATENT DOCUMENTS

| JP | 63-98627 | 6/1988 |
| JP | 63-310112 | 12/1988 |
| JP | 2005-150573 | 6/2005 |
| JP | 2009-194001 | 8/2009 |
| JP | 2012-119453 | 6/2012 |

* cited by examiner

*Primary Examiner* — Cheung Lee
(74) *Attorney, Agent, or Firm* — Oblon, Spivak, McClelland, Maier & Neustadt, L.L.P.

(57) ABSTRACT

A heat treatment method of the present invention includes mounting a plurality of semiconductor wafers upright on a treatment boat in parallel to each other, inserting the treatment boat in a space above an injector located in a tube to be oriented to plane surfaces of the semiconductor wafers in parallel to an extending direction of the tube, and heating the tube while continuously supplying source gas into the tube through openings of the injector.

12 Claims, 9 Drawing Sheets

HEAT TREATMENT METHOD OF SEMICONDUCTOR WAFERS, MANUFACTURING METHOD OF SOLAR BATTERY, AND HEAT TREATMENT DEVICE

BACKGROUND OF THE INVENTION

1. Field of the Invention

The present invention relates to a heat treatment method for performing diffusion to semiconductor wafers and oxidization thereof by using source gas, and to a manufacturing method of a solar battery and a heat treatment device using the heat treatment method of semiconductor wafers.

2. Description of the Related Art

Heat treating furnaces for semiconductor wafers, having a cylindrical tube made of quartz as a process chamber and a heater arranged on an outer periphery of the tube are commonly used. For example, when heat diffusion treatment of diffusing desired impurities into wafers is to be performed, impurity diffusion can be caused on surfaces of semiconductor wafers placed in the heated quartz tube by continuously introducing source gas, which contains a dopant, into the tube. This method is called "open tube diffusion" and is used also in an impurity diffusion process for a solar battery having silicon wafers as cells.

Forms of the heat treating furnace are divided into a vertical type and a horizontal type by placement methods of a quartz tube and the vertical furnace is designed to rotate semiconductor wafers in the quartz tube to enhance uniformity of treatment. In the field of solar batteries, horizontal furnaces that excel in mass production are often used and large heat treating furnaces having a quartz tube with a total length of 1000 millimeters (mm) to 1500 millimeters are used. When semiconductor wafers are to be processed in the horizontal furnace, a treatment boat for supporting upright semiconductor wafers (a single semiconductor wafer or one assembly including a plurality of semiconductor wafers arranged in parallel to an extending direction of the tube) is used.

A supply method of source gas is a primary element that affects uniformity of heat treatment, and a current plate for controlling a gas flow or an injector for uniformly supplying gas into a quartz tube may be used to enhance uniformity in impurity diffusion within wafer surfaces. The injector is a gas introducing tube installed in a long quartz tube and has a plurality of gas injection holes to uniformly supply gas into the quartz tube.

In an example of the heat diffusion treatment where phosphorous (P) is to be diffused as n-type impurities into silicon (Si) semiconductor wafers, phosphorus trichloride ($POCl_3$) is vaporized and mixed with nitrogen gas or oxygen gas to obtain source gas. Reaction formulae thereof are as follows:

$$2POCl_3 + (3/2)O_2 \rightarrow P_2O_5 + 3Cl_2 \quad (1)$$

$$P_2O_5 + (5/2)Si \rightarrow 2P + (5/2)SiO_2 \quad (2)$$

Chemical reactions shown in the formulae (1) and (2) occur in a furnace at 800° C. to 1000° C.

When oxidization treatment is to be performed, oxygen gas, water vapor, or the like may be used as source gas.

Japanese Utility Model Application Publication No. 63-098627 describes a method of uniformizing treatment by placing a quartz plate as a current plate for every predetermined number of semiconductor wafers on a boat made of quartz. Japanese Patent Application Laid-open No. 2009-194001 describes a heat treatment furnace in which four injectors (gas outlet pipes) are arranged in a tube and gas injection holes (openings) are arrayed according to a pitch in which semiconductor wafers are arranged. In both conventional techniques, the semiconductor wafers are arranged perpendicular to a tube extending direction, that is, in such a manner that vertical lines of planes constituting front or rear surfaces of the semiconductor wafers extend along the tube extending direction.

When the current plate or the injector is used as described above, in-plane uniformity in a semiconductor wafer or uniformity among individual semiconductor wafers can be enhanced. However, even when the method as described in Japanese Utility Model Application Publication No. 63-098627 or Japanese Patent Application Laid-open No. 2009-194001 is used, the source gas needs to be discharged from an end of the tube and thus a flow of the source gas in a direction of traversing the arranged semiconductor wafers occurs. The source gas has a substantially atmospheric pressure and the gas flow is a viscous flow. Accordingly, behavior of the gas near peripheries of the semiconductor wafers is complicated. For example, an air eddy may occur near the peripheries of the semiconductor wafers, or gas disturbance easily occurs in spaces between the arranged semiconductor wafers due to entry of the gas into the spaces between the semiconductor wafers. Such situations are factors that cause non-uniformity in the semiconductor wafer treatment.

Meanwhile, fluctuations in an amount of heat diffusion to the semiconductor wafers cause fluctuations in device characteristics. For example, in a case where impurities are to be heat-diffused into wafers for solar battery cells, sheet resistance is increased and conduction loss is increased when a diffusion amount is insufficient, while many defects arise in the wafers and photoelectric conversion efficiency is reduced due to recombination of carriers when a diffusion amount is too large.

SUMMARY OF THE INVENTION

It is an object of the present invention to at least partially solve the problems in the conventional technology.

According to an aspect of the present invention a heat treatment method of semiconductor wafers uses a heat-resistant tube extending in a horizontal direction as a process chamber; a gas pipe is installed in an inner lower portion of the tube; and a treatment boat is placed in the tube, and the treatment boat includes a pair of first shield plates that shields entire side surfaces of a plurality of semiconductor wafers mounted on the treatment boat in parallel to each other; the heat treatment method includes: heating the tube while supplying source gas into the tube, thereby performing heat treatment to the semiconductor wafers mounted on the treatment boat; mounting the semiconductor wafers upright in parallel to each other on the treatment boat; inserting the treatment boat into a space above the gas pipe in the tube to be oriented to plane surfaces of the semiconductor wafers in parallel to an extending direction of the tube; and continuously supplying the source gas into the tube from an opening of the gas pipe and heating the tube.

According to another aspect of the present invention a heat treatment method of semiconductor wafers uses a heat-resistant tube extending in a horizontal direction as a process chamber; a pipe is installed in inner upper and lower portions of the tube, respectively; a treatment boat is placed in the tube, and the treatment boat includes a pair of first shield plates that shields entire side surfaces of a plurality of semiconductor wafers mounted on the treatment boat in parallel to each other; the heat treatment method includes: heating the tube while supplying source gas into the tube, thereby performing heat treatment to the semiconductor wafers mounted on the treatment boat; mounting the semiconductor wafers upright in parallel to each other on the treatment boat; inserting the treatment boat into a space between the pipes in the tube to be oriented to plane surfaces of the semiconductor wafers in parallel to an extending direction of the tube; and alternately flowing in and out the source gas through openings of the pipes located above and below the treatment boat and heating the tube.

According to still another aspect of the present invention a heat treatment device includes: a heat-resistant tube that extends in a horizontal direction and in which a gas pipe continuously supplying source gas is installed in an inner lower portion of the tube; a treatment boat on which a plurality of semiconductor wafers are mounted upright in parallel to each other and that is placed in a space above the gas pipe in the tube; and a heater that heats the tube from outside, the heat treatment device performing heat treatment to the semiconductor wafers mounted on the treatment boat by using the tube as a process chamber, and a pair of first shield plates that shields entire side surfaces of the semiconductor wafers are included, and the treatment boat is placed in the tube to be oriented to plane surfaces of the semiconductor wafers in parallel to an extending direction of the tube.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of a heat treatment method of semiconductor wafers, a manufacturing method of a solar battery, and a heat treatment device according to the present invention will be explained below in detail with reference to the accompanying drawings. The present invention is not limited to the embodiments and can be modified as appropriate without departing from the scope of the invention. In addition, because schematic illustrations are provided in the drawings, scales of constituent elements may be different from those in practice.

First Embodiment

Figure 1:
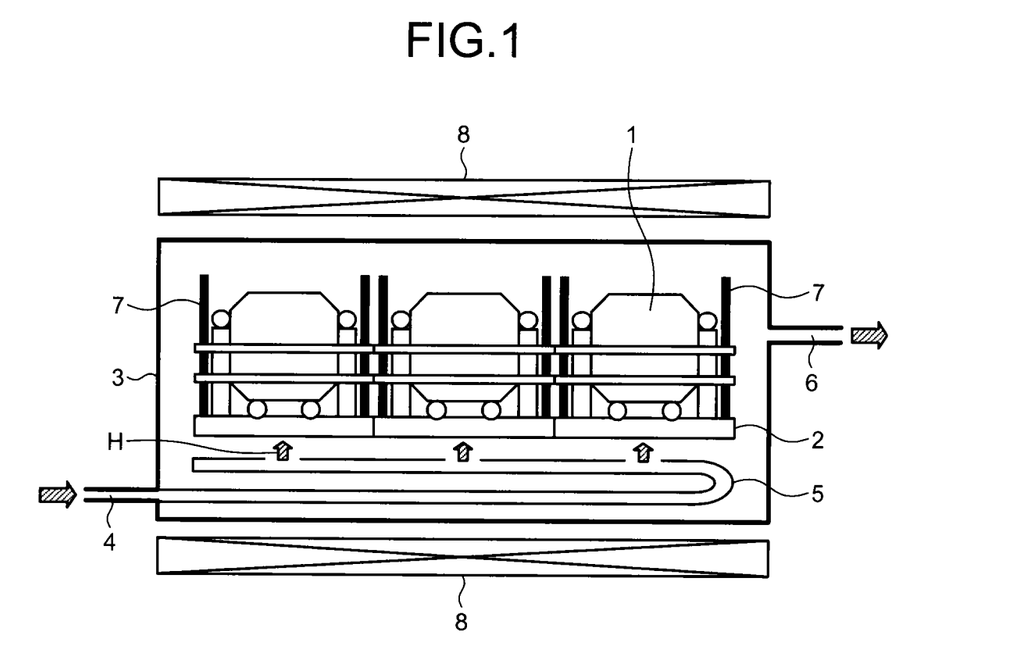
FIG. 1 is a schematic diagram of a configuration of a heat treatment device used in a heat treatment method according to a first embodiment of the present invention.

FIG. 1 is a schematic diagram of a configuration of a heat treatment device used in a heat treatment method according to a first embodiment of the present invention. A tube 3 to be used as a process chamber is placed horizontally within a heater 8, and an injector 5 as a gas pipe for introducing source gas into the tube 3 is installed within the tube 3 at a lower portion thereof. The injector 5 is connected to an inlet 4 of the tube 3 and has ejection holes H as openings to inject the source gas into the tube 3. In the tube 3, a plurality of semiconductor wafers 1 mounted on a treatment boat 2 are arranged in parallel to an extending direction of the tube 3, and the tube 3 is heated by the heater 8 to perform heat treatment in a state where the source gas is continuously supplied to the tube 3.

The semiconductor wafers 1 are housed in one treatment boat 2 in such a manner to overlap with each other in parallel and at regular intervals. The treatment boat 2 is inserted in a direction to be oriented to planes of the semiconductor wafers 1 in parallel to the extending direction of the tube 3. First shield plates 7 are installed on the treatment boat 2 to shield the entire side surfaces of the upright semiconductor wafers 1, that is, the entire end surfaces on right and left ends of the semiconductor wafers 1 shown in FIG. 1.

The introduced source gas and gas produced by reaction is discharged from an outlet 6 located at an end of the tube 3. The first shield plates 7 can limit the source gas to flow into spaces between the semiconductor wafers 1, which are arranged in parallel to the extending direction of the tube 3, from the extending direction of the tube 3.

The treatment boat 2 may be supported by a support member (not shown) within the tube 3. In this example, the tube 3, the injector 5, and the heater 8 shown in FIG. 1, and peripheries thereof are collectively referred to as a heat treating furnace. The extending direction of the tube 3 is a direction from the inlet 4 to the outlet 6 and a cross-section of the tube 3 cut along a plane orthogonal to the extending direction is substantially circular.

While the ejection holes H are formed to face upward in FIG. 1, the orientation of the holes may be properly changed. The number, size, and shape of the ejection holes H may be also suitably designed to appropriately supply the source gas to the treatment boat 2. To supply the source gas uniformly to the plurality of semiconductor wafers 1, a diffuser panel having an opening or a rod-like shielding member may be placed at positions facing the ejection holes H to broaden the gas flow.

As described above, the semiconductor wafers 1 are generally placed orthogonal to the extending direction of the tube 3. This is because heating by the heater 8 is uniformized and accordingly treatment with little inter-individual differences in temperatures of the semiconductor wafers 1 can be performed. In this general arrangement, however, the source gas flows toward the outlet 6 at the end of the tube 3 and thus the source gas flow and the semiconductor wafers 1 are positioned to be mutually orthogonal. Therefore, when the source gas flows across ends of the semiconductor wafers 1, an air eddy may occur in the vicinity of the peripheries of the semiconductor wafers 1.

Meanwhile, when the semiconductor wafers 1 are arranged in parallel to the extending direction of the tube 3, the semiconductor wafers 1 are substantially parallel to the flow of the source gas in the tube 3. The first shield plates 7 prevent the gas that flows in the extending direction of the tube 3 from entering in spaces between the semiconductor wafers 1 and, even when large-sized semiconductor wafers 1 are used, an air eddy of the source gas may not occur at wafer ends. Because the gas flow is stabilized in the vicinities of the surfaces of the semiconductor wafers 1, a uniform reaction occurs and heat treatment having high uniformity within the semiconductor wafers 1 can be performed.

Figure 2:
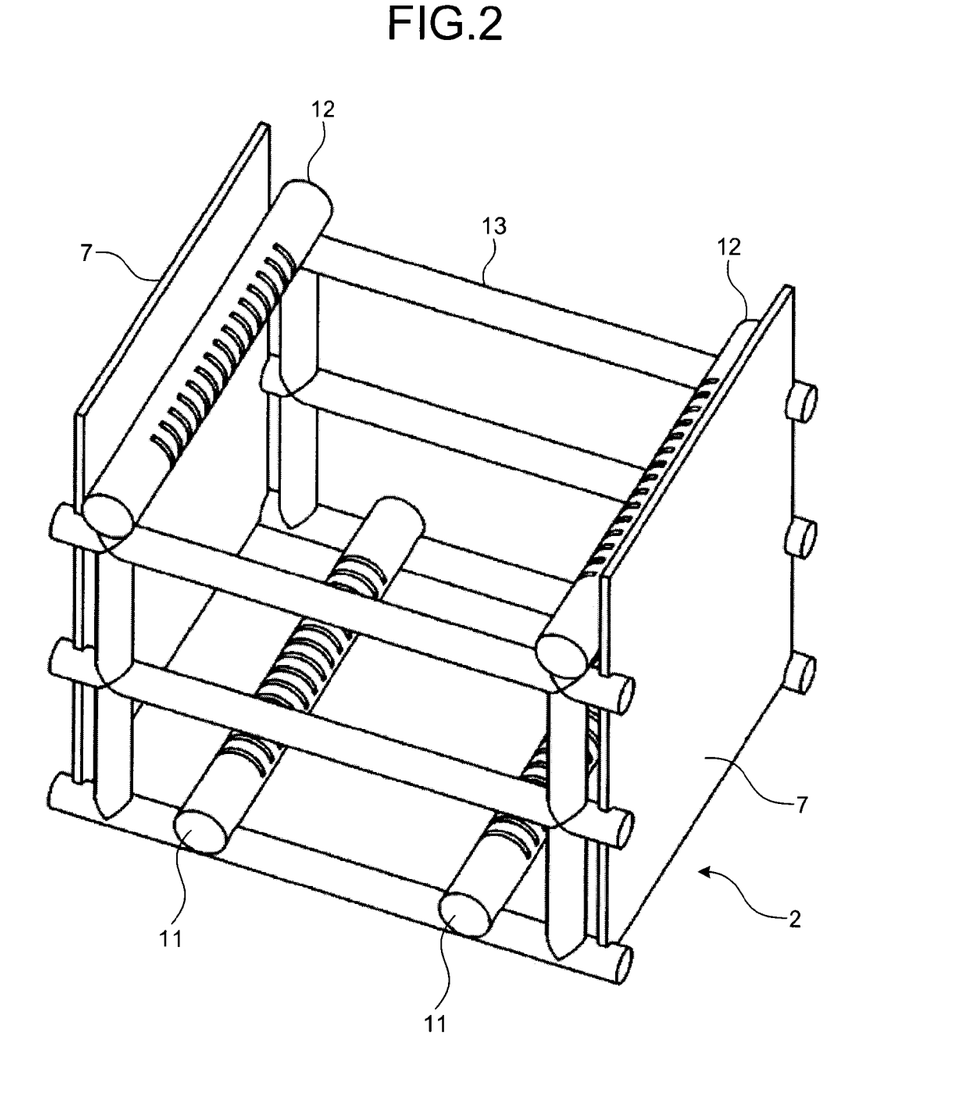
FIG. 2 is a perspective view of a configuration example of a treatment boat according to the first embodiment.
Figure 3:
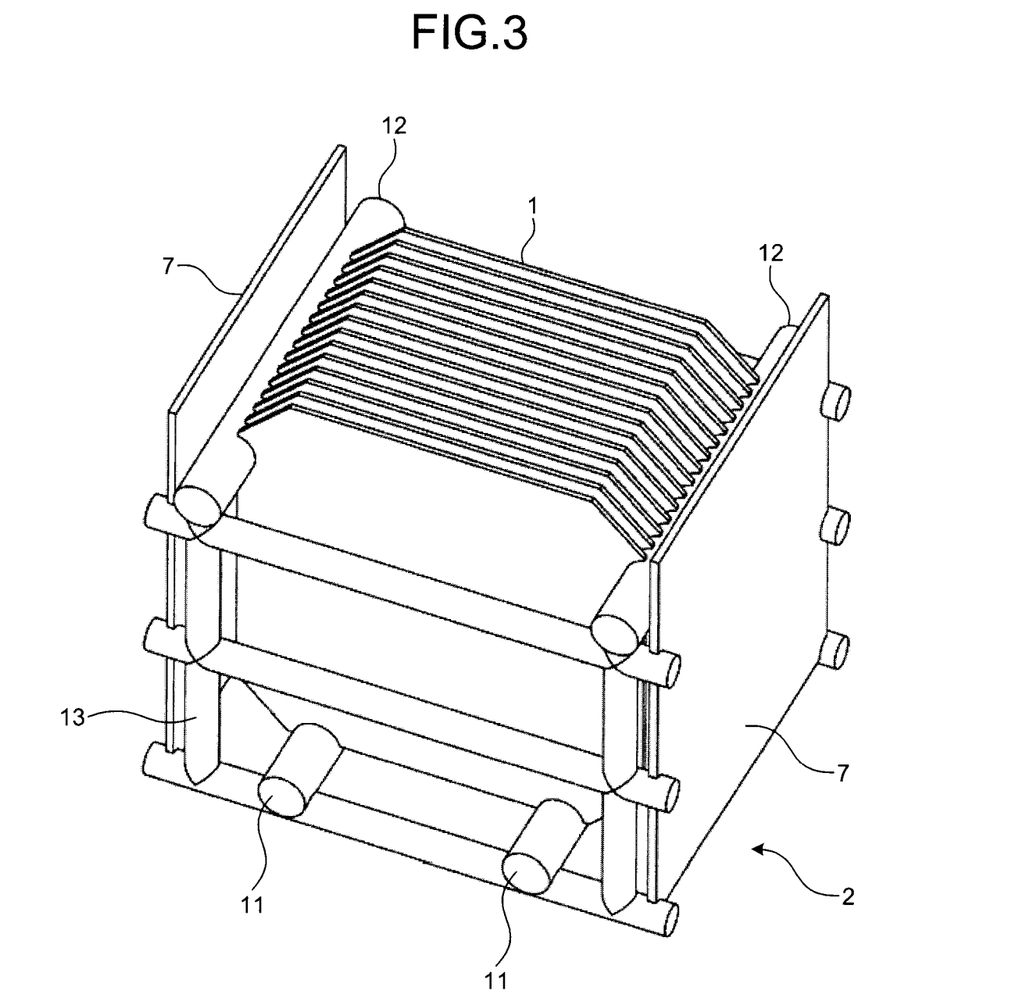
FIG. 3 is a perspective view of the treatment boat according to the first embodiment in a state where semiconductor wafers are mounted thereon.

FIG. 2 is a perspective view of a configuration example of the treatment boat 2. Many semiconductor wafers 1 can be mounted upright on the treatment boat 2. Support units 11 support lower portions of the semiconductor wafers 1 and have a plurality of grooves formed thereon. Each of the semiconductor wafers 1 engages with each of the grooves so that a position of the semiconductor wafers 1 is stabilized. Support units 12 similarly support upper side portions of the semiconductor wafers 1 and each groove formed thereon can support surfaces of both sides of each semiconductor wafer 1. A frame unit 13 fixes the support units 11 and the support units 12 to constitute the entirety. The first shield plates 7 are located on outer sides of the support units 12 so as to shield side-surfaces of the treatment boat 2. The first shield plates 7 may be welded to the frame unit 13 to be in a completely-fixed state or may be supported by being fitted into grooves. FIG. 3 is a perspective view of the treatment boat 2 in a state where the semiconductor wafers 1 are mounted thereon. The first shield plates 7 may have a shape with chamfered corners considering that the first shield plates 7 are inserted into the tube 3 circular in cross-section.

Quartz is generally used as a material of the treatment boat 2 for reasons of heat resistance, durability against corrosive source gas, manufacturability, and the like, and quartz may be used also for the first shield plates 7. The first shield plates 7 may be made of another material having heat resistance of 850° C. or higher, such as ceramics.

A specific heat treatment process using the horizontal heat treating furnace and the treatment boat 2 will be explained. The semiconductor wafers 1 are first mounted on the treatment boat 2 and then the treatment boat 2 is inserted into a space above the injector 5 in the tube 3. A cylindrical quartz tube is usually used as the tube 3 and, when a flange is used at an end of the cylinder, the flange may be made of a material other than quartz. The heater 8 is powered on to heat the tube 3 at about 850° C. and the source gas is introduced into the tube 3.

For example, when phosphorus is to be diffused into the semiconductor wafers 1 of silicon, source gas of phosphorus may be prepared by using a bubbler (not shown). For example, nitrogen gas is used as carrier gas and bubbling is performed by using the bubbler, thereby evaporating liquid phosphorus trichloride at a room temperature. The evaporated phosphorus trichloride gas is mixed with oxygen gas to obtain source gas and the source gas is supplied through the inlet 4 in a state of mixed gas.

The injector 5 has a U-shaped configuration folding back in the tube 3 and the source gas is heated in the injector 5 until it reaches the ejection holes H. The source gas ejected from the ejection holes H reaches a lower portion of the treatment boat 2 and movers upward by an effect of an upward initial velocity and an effect of gradual increase in the temperature due to further heating after ejection. The source gas continuously flows into the treatment boat 2 from the lower portion of the treatment boat 2 and continuously flows out to an upper side of the treatment boat 2. Therefore, it may be considered that a substantially steady gas flow is produced. The reactions shown by the formulae (1) and (2) occur on the surfaces of the silicon semiconductor wafers 1 and generated phosphorus is diffused into the semiconductor wafers 1.

At this time, the first shield plates 7 prevent the gas from entering through the ends of the semiconductor wafers 1 and thus a gas flow substantially close to a laminar flow is produced in spaces between adjacent ones of the semiconductor wafers 1 in the treatment boat 2. If the first shield plates 7 are not used, the source gas flows into the spaces between adjacent ones of the semiconductor wafers 1 in the extending direction of the tube 3 and accordingly the gas flow on the surfaces of the semiconductor wafers 1 becomes complicated, which may easily cause fluctuations in diffusion amounts due to slight differences in various conditions such as the temperature and the gas flow rate.

The source gas introduced into the tube 3 is discharged outside of the tube 3 through the outlet 6 and appropriately treated by passing through a filter (not shown) and the like.

The first shield plates 7 need to cover the entire area of the ends of the semiconductor wafers 1. Accordingly, it is desirable at least that upper ends thereof be higher than upper ends of the semiconductor wafers 1 and that lower ends thereof be lower than lower ends of the semiconductor wafers 1. For example, when the semiconductor wafers 1 having a size of 156 mm×156 mm are to be treated, the first shield plates 7 need to be at least 2 millimeters or more higher than the upper ends of the semiconductor wafers 1 and 2 millimeters or more lower than the lower ends of the semiconductor wafers 1. The shielding effect is higher when the differences in height between the first shield plates 7 and the semiconductor wafers 1 are larger. Practically, there are restrictions on the diameter of the tube 3 according to a device installation area or costs, and it is effective for practical use that the differences are about 2 millimeters to 10 millimeters.

The semiconductor wafers 1 arranged on both ends of the parallel-arranged semiconductor wafers 1 are usually handled as dummy wafers. This is because conditions of the wafers arranged outermost are different from those of wafers arranged inside.

While the first shield plates 7 are integrated with the treatment boat 2 in FIGS. 1 to 3, it is needless to mention that the same effect can be obtained even when the treatment boat 2 and the first shield plates 7 are separately arranged side by side.

By using the treatment boat 2 having the configuration mentioned above in the horizontal heat treating furnace, the gas flow in the spaces between adjacent ones of the semiconductor wafers 1 is stabilized and heat treatment with high uniformity within the semiconductor wafers 1 can be achieved.

Second Embodiment

Figure 4:
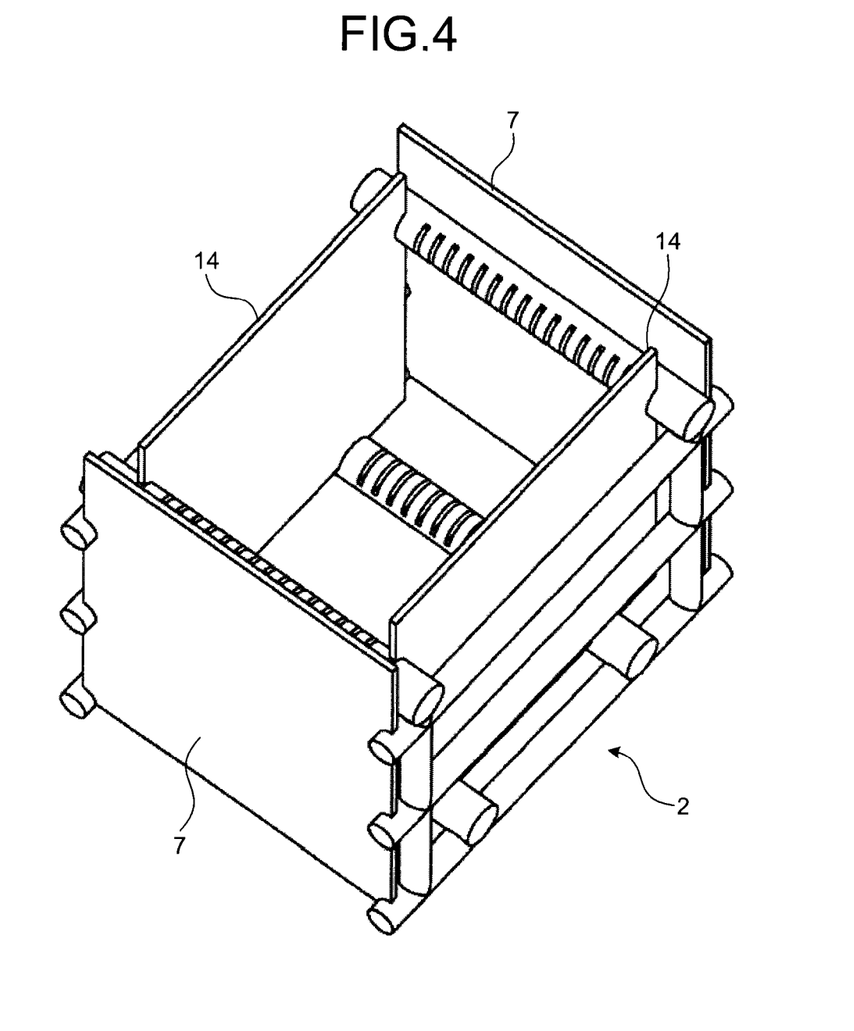
FIG. 4 is a perspective view of a configuration example of a treatment boat according to a second embodiment of the present invention.

FIG. 4 is a perspective view of a configuration example of the treatment boat 2 according to a second embodiment of the present invention. The treatment boat 2 according to the second embodiment is different from that according to the first embodiment only in having second shield plates 14 parallel to the semiconductor wafers 1 at both ends of a portion on which the semiconductor wafers 1 are mounted, respectively, and other configurations are the same as those in the first embodiment. Four sides surrounding the semiconductor wafers 1 may be shielded by the pair of first shield plates 7 and the pair of second shield plates 14. With this configuration, the source gas flow moving upward in the treatment boat 2 may be more stabilized and thus heat treatment with higher uniformity within wafers including the semiconductor wafers 1 located outermost can be achieved. By using, as the second shield plates 14, ceramic plates that do not easily transmit infrared rays, the inter-individual differences in the temperatures of the semiconductor wafers 1 heated by the heater 8 can be reduced.

Third Embodiment

Figure 5:
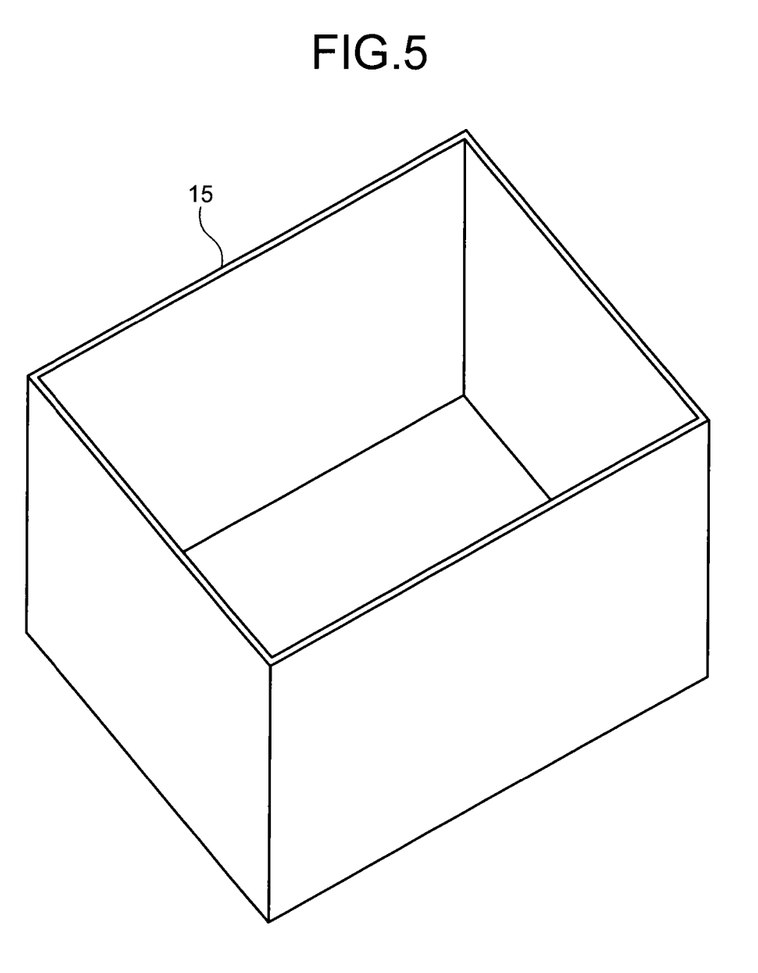
FIG. 5 is a perspective view of a configuration of a shield tube that encompasses an outer periphery of a treatment boat according to a third embodiment of the present invention.

FIG. 5 is a perspective view of a configuration of a shield tube 15 that encompasses the periphery of the treatment boat 2 according to a third embodiment of the present invention. The shield tube 15 is formed by integrating the first shield plates 7 and the second shield plates 14 according to the second embodiment and is placed around the treatment boat 2 not having the first and second shield plates to encompass the side surfaces thereof, thereby shielding the four sides of the treatment boat 2. Because the source gas flow moving upward in the treatment boat 2 can be stabilized by encompassing the treatment boat 2 with the shield tube 15, heat treatment with high uniformity within the semiconductor wafers 1 can be achieved. Other features of the third embodiment are identical to those of the first embodiment.

Fourth Embodiment

Figure 6:
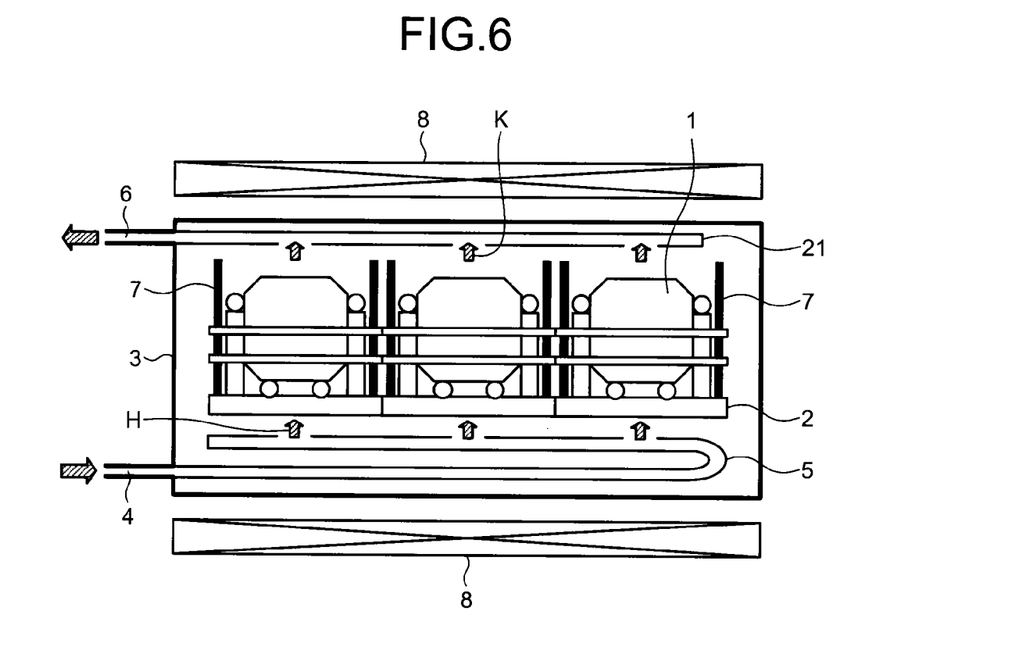
FIG. 6 depicts a configuration of a heat treatment device used in a heat treatment method according to a fourth embodiment of the present invention.

FIG. 6 depicts a configuration of a heat treatment device used in a heat treatment method according to a fourth embodiment of the present invention. The injector 5 as the gas pipe is placed below the treatment boat 2 and the ejection holes H are provided on the injector 5 as the openings for ejecting the source gas. A discharge pipe 21 is provided above the treatment boat 2 and discharge holes K are provided on the discharge pipe 21 as openings for discharging the source gas outside of the tube 3. Because the injector 5 and the discharge pipe 21 are provided below and above the treatment boat 2, respectively, it is possible to move upward the source gas flow in the treatment boat 2 in a stable manner, thus heat treatment with high uniformity within the semiconductor wafers 1 can be achieved. Other features of the fourth embodiment are identical to those of the first embodiment.

Fifth Embodiment

Figure 7:
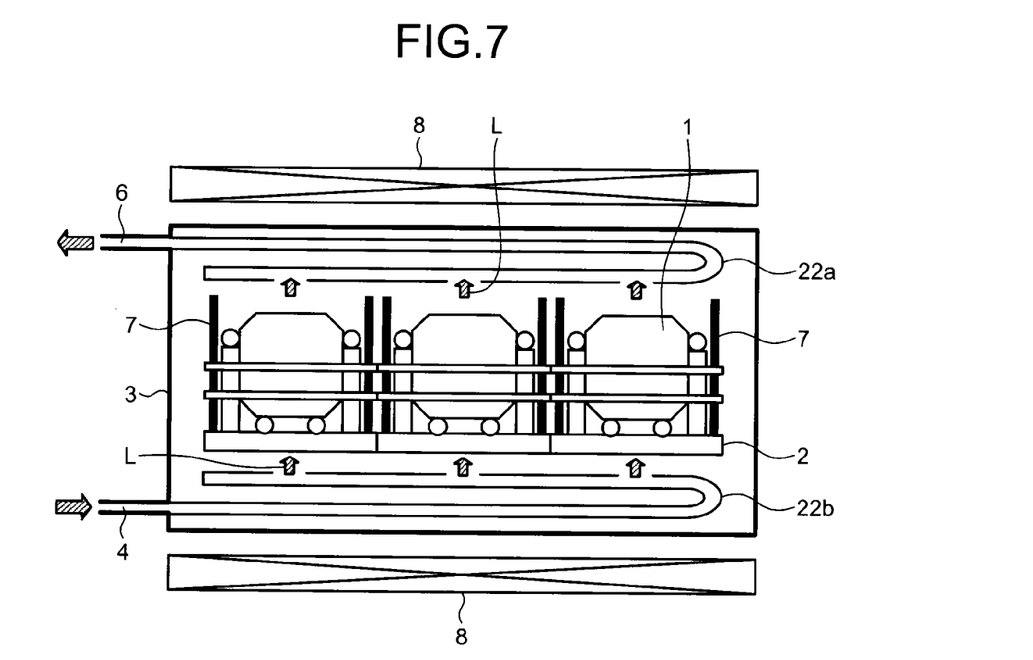
FIG. 7 depicts a configuration of a heat treatment device used in a heat treatment method according to a fifth embodiment of the present invention.
Figure 8:
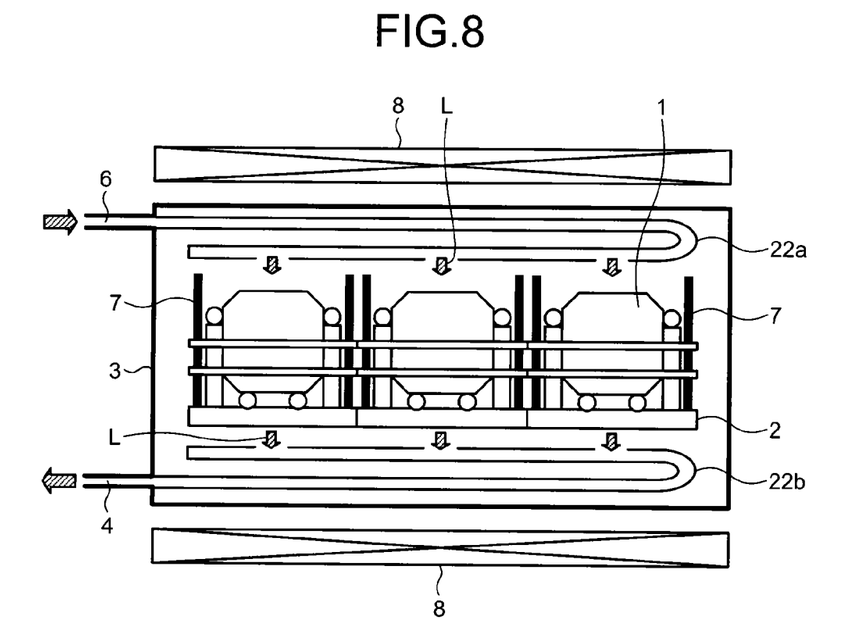
FIG. 8 depicts a configuration of the heat treatment device used in the heat treatment method according to the fifth embodiment.

FIGS. 7 and 8 depict a configuration of a heat treatment device used in a heat treatment method according to a fifth embodiment of the present invention. Pipes 22a and 22b are provided within the tube 3 at upper and lower portions thereof, respectively, and openings L are provided on the pipes 22a and 22b as openings for discharging and ejecting the source gas. The treatment boat 2 is inserted into a space between the pipes 22a and 22b in the tube 3 to be oriented to the planes of the semiconductor wafers 1 in parallel to the extending direction of the tube 3. The pipes 22a and 22b can stabilize the source gas flow in the treatment boat 2 by alternately performing discharge and ejection of the source gas as shown in FIGS. 7 and 8. Fresh gas that has not contacted with the wafers is alternately supplied into the tube 3 from above and below. That is, a state where the source gas is ejected from the openings L of the pipe 22b to cause the source gas to flow into the treatment boat 2 from the lower side and the source gas flowing out of the treatment boat 2 to the upper side is discharged outside of the tube 3 from the openings L of the pipe 22a; and a state where the source gas is ejected from the openings L of the pipe 22a to cause the source gas to flow into the treatment boat 2 from the upper side and the source gas flowing out of the treatment boat 2 to the lower side is discharged outside of the tube 3 from the openings L of the pipe 22b are alternately caused, thereby preventing a ratio of already-reacted gas in the upper side of the treatment boat 2 from increasing and stabilizing the source gas flow. Accordingly, treatment with higher uniformity than that in the fourth embodiment can be achieved. Other features of the fifth embodiment are identical to those of the first embodiment.

Sixth Embodiment

Figure 9:
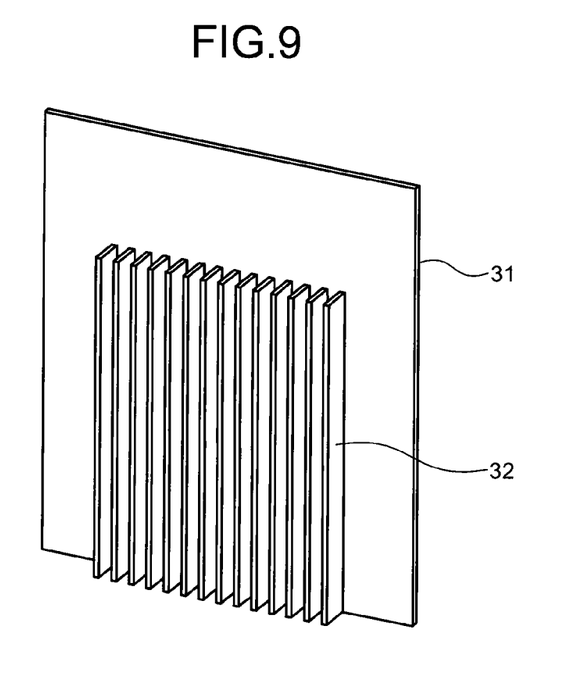
FIG. 9 is a perspective view of a configuration of a shield plate that encompasses a treatment boat according to a sixth embodiment of the present invention.
Figure 10:
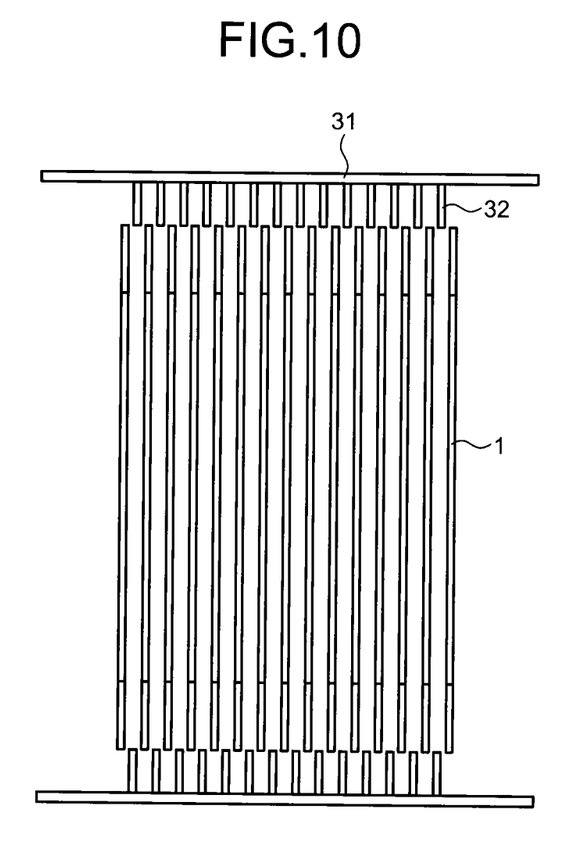
FIG. 10 is a top view of a configuration of the shield plate that encompasses the treatment boat according to the sixth embodiment.

FIG. 9 is a perspective view of a configuration of a first shield plate 31 for a treatment boat according to a sixth embodiment of the present invention. FIG. 10 is a top view of the first shield plates 31 for the treatment boat according to the sixth embodiment. The first shield plate 31 is formed by modifying the first shield plate 7 in the first embodiment. Fins 32 (convex portions) are provided at the same intervals as those of the semiconductor wafers 1 mounted in parallel on the treatment boat thus flows of the source gas around behind the semiconductor wafers 1 at the ends of the semiconductor wafers 1 in the treatment boat can be reduced. That is, the first shield plates 31 each include the fins 32 on the side of the semiconductor wafers 1 as a protruding configuration that blocks spaces between the semiconductor wafers 1. As compared to the first embodiment, heat treatment with higher uniformity between the semiconductor wafers 1 adjacent to each other in the treatment boat can be achieved because of the reduced flows of the source gas around behind the semiconductor wafers 1. Other features of the sixth embodiment are identical to those of the first embodiment.

Seventh Embodiment

An embodiment of a manufacturing method of solar battery cells according to the present invention will be explained as a seventh embodiment of the present invention. To manufacture solar battery cells, it suffices to diffuse phosphorus into p-type silicon wafers having boron (B) added thereto, by using the heat treatment method according to any of the first to sixth embodiments, to form an n-type layer on each wafer surface, for example. This forms a p-n junction inside of each p-type silicon wafer and thus a built-in potential difference can be generated. To draw out a current generated by photovoltaic power, a plurality of thin wire electrodes are formed on the n-type layer and a rear-surface electrode is formed on the entire rear surface of the wafer. Generally, an antireflection layer or the like is formed on the n-type layer to increase light use efficiency. To use the solar cells for a solar battery, it suffices to arrange the cells on a glass substrate, install electrical wiring, and perform sealing with an ethyle vinyl acetate (EVA) resin or the like.

Example

To examine the effect of the first shield plates 7 installed on the treatment boat 2, treatment was performed under the same conditions except that the first shield plates 7 are provided in one example and are not provided in the other, and distribution of sheet resistances in the semiconductor wafers 1 was measured. Monocrystalline silicon wafers having a size of 156 mm×156 mm with corners chamfered by 16 mm±2 mm were used as the semiconductor wafers 1 and phosphorus diffusion treatment was performed by the method according to the first embodiment. The first shield plates 7 had a dimension of 160 mm×160 mm with corners chamfered by 20 millimeters.

Figure 11:
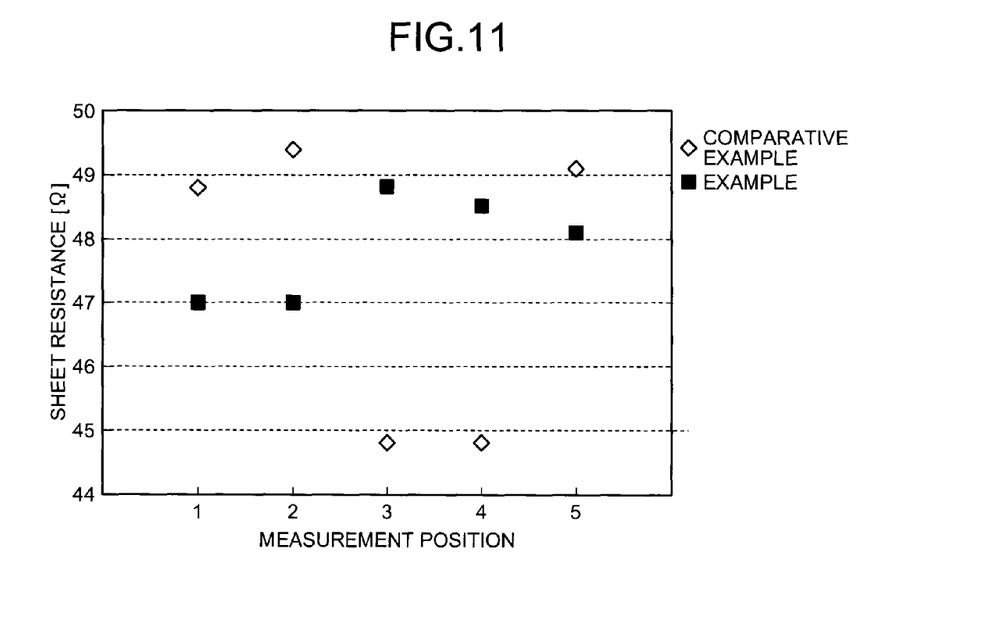
FIG. 11 is a graph of results obtained by measuring local sheet resistances of semiconductor wafers.
Figure 12:
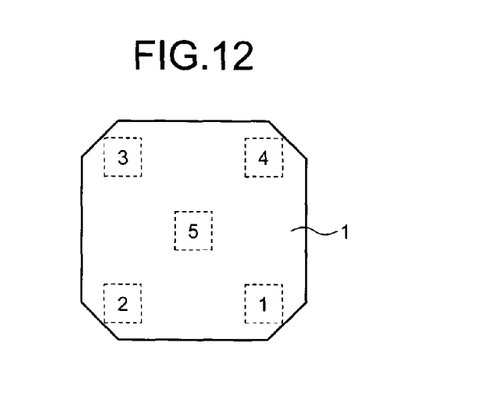
FIG. 12 is a schematic diagram of numbers indicating measurement positions on a semiconductor wafer.

FIG. 11 is a graph of results obtained by measuring local sheet resistances of the semiconductor wafers 1 by a four probe method after performing the diffusion treatment. FIG. 12 is a schematic diagram of numbers indicating measurement positions on the semiconductor wafer 1. The results shown in FIG. 11 indicate that use of the first shield plates 7 has reduced fluctuations in the semiconductor wafer 1 and provided the diffusion treatment with high uniformity.

According to the present invention, gas flow disturbance caused on peripheries of semiconductor wafers mounted on a treatment boat or in spaces between the semiconductor wafers can be suppressed, and uniform heat treatment can be performed on the semiconductor wafers.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A heat treatment method of semiconductor wafers, wherein
   the method uses a heat-resistant tube extending in a horizontal direction as a process chamber;
   a gas pipe is installed in an inner lower portion of the tube; and
   a treatment boat is placed in the tube, wherein the treatment boat includes a pair of first shield plates that shields entire side surfaces of a plurality of semiconductor wafers mounted on the treatment boat in parallel to each other; the heat treatment method comprising:
   heating the tube while supplying source gas into the tube, thereby performing heat treatment to the semiconductor wafers mounted on the treatment boat;
   mounting the semiconductor wafers upright in parallel to each other on the treatment boat;
   inserting the treatment boat into a space above the gas pipe in the tube to be oriented to plane surfaces of the semiconductor wafers in parallel to an extending direction of the tube; and
   continuously supplying the source gas into the tube from an opening of the gas pipe and heating the tube.

2. The heat treatment method of semiconductor wafers according to claim 1, wherein the source gas is continuously flowed into the treatment boat from below the treatment boat and is continuously flowed to an upper side of the treatment boat.

3. The heat treatment method of semiconductor wafers according to claim 2, wherein
   a discharge pipe is placed inside of the tube at an upper portion thereof, and
   the source gas flowed to the upper side of the treatment boat is continuously discharged from an opening of the discharge pipe.

4. The heat treatment method of semiconductor wafers according to claim 1, wherein the first shield plates having upper ends 2 millimeters or more higher than upper ends of the semiconductor wafers mounted on the treatment boat and having lower ends 2 millimeters or more lower than lower ends of the semiconductor wafers shield the entire side surfaces of the semiconductor wafers.

5. The heat treatment method of semiconductor wafers according to claim 1, wherein the treatment boat further including second plates parallel to the semiconductor wafers is used to shield around the semiconductor wafers.

6. The heat treatment method of semiconductor wafers according to claim 1, wherein the first shield plates have protruding configurations that block spaces between semiconductor wafers on sides of the semiconductor wafers.

7. A manufacturing method of a solar battery, wherein heat diffusion treatment is performed by the heat treatment method of semiconductor wafers according to claim 1 while using gas including a dopant as the source gas, thereby forming an impurity diffusion layer on a surface of each of the semiconductor wafers to form a p-n junction inside of each of the semiconductor wafers.

8. A heat treatment method of semiconductor wafers, wherein
   the method uses a heat-resistant tube extending in a horizontal direction as a process chamber;
   a pipe is installed in inner upper and lower portions of the tube, respectively; and
   a treatment boat is placed in the tube, wherein the treatment boat includes a pair of first shield plates that shields entire side surfaces of a plurality of semiconductor wafers mounted on the treatment boat in parallel to each other; the heat treatment method comprising:
   heating the tube while supplying source gas into the tube, thereby performing heat treatment to the semiconductor wafers mounted on the treatment boat;
   mounting the semiconductor wafers upright in parallel to each other on the treatment boat;
   inserting the treatment boat into a space between the pipes in the tube to be oriented to plane surfaces of the semiconductor wafers in parallel to an extending direction of the tube; and
   alternately flowing in and out the source gas through openings of the pipes located above and below the treatment boat and heating the tube.

9. The heat treatment method of semiconductor wafers according to claim 8, wherein the first shield plates having upper ends 2 millimeters or more higher than upper ends of the semiconductor wafers mounted on the treatment boat and having lower ends 2 millimeters or more lower than lower ends of the semiconductor wafers shield the entire side surfaces of the semiconductor wafers.

10. The heat treatment method of semiconductor wafers according to claim 8, wherein the treatment boat further including second plates parallel to the semiconductor wafers is used to shield around the semiconductor wafers.

11. The heat treatment method of semiconductor wafers according to claim 8, wherein the first shield plates have protruding configurations that block spaces between semiconductor wafers on sides of the semiconductor wafers.

12. A manufacturing method of a solar battery, wherein heat diffusion treatment is performed by the heat treatment method of semiconductor wafers according to claim 8 while using gas including a dopant as the source gas, thereby forming an impurity diffusion layer on a surface of each of the semiconductor wafers to form a p-n junction inside of each of the semiconductor wafers.

* * * * *